United States Patent
Kim

(10) Patent No.: US 6,972,437 B2
(45) Date of Patent: Dec. 6, 2005

(54) ALGAINN LIGHT EMITTING DIODE

(75) Inventor: Chang-Tae Kim, Sungnam-Si (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 10/445,221

(22) Filed: May 27, 2003

(65) Prior Publication Data
US 2004/0195578 A1 Oct. 7, 2004

(30) Foreign Application Priority Data
Apr. 4, 2003 (KR) .................... 10-2003-0021379

(51) Int. Cl.[7] .............................................. H01L 29/22
(52) U.S. Cl. ...................... 257/94; 257/97; 257/95; 257/101; 257/102
(58) Field of Search ........................ 257/94, 95, 97, 257/101, 102, 91, 103, 190; 435/29, 35, 38

(56) References Cited

U.S. PATENT DOCUMENTS 5,874,803 A * 2/1999 Garbuzov et al. .......... 313/506
6,133,589 A * 10/2000 Krames et al. ............. 257/103
6,233,265 B1 * 5/2001 Bour et al. .................. 372/45
6,649,939 B1 * 11/2003 Wirth .......................... 257/95
6,670,751 B2 * 12/2003 Song et al. .................. 313/512

* cited by examiner

Primary Examiner—Eddie Lee
Assistant Examiner—Thomas Magee
(74) Attorney, Agent, or Firm—Blackwell Sanders Peper Martin LLP

(57) ABSTRACT

Disclosed is an AlGaInN LED with improved external quantum efficiency, in which a chip employing the LED has a horizontal plane formed in a lozenge shape so that the amount of total reflection of light is reduced when the light generated from an active layer interposed between heterosemiconductor layers with different band gaps is emitted to the outside. Since the horizontal plane of the LED is formed to have a lozenge shape so that the amount of total reflection of light generated in the LED is reduced, it is possible to maximize external quantum efficiency determined by the degree of emission of the light generated in the active layer. The cleaved plane of the LED coincides with the crystal orientation of a wafer made of GaN or sapphire, thus improving the yield of the LED when the LED is cut and produced. Since an anode and a cathode of the LED are disposed so that they diagonally face each other, it is possible to optimize the current spreading between the anode and the cathode and to improve luminous efficiency so that light generated in the active layer is uniformly emitted.

3 Claims, 8 Drawing Sheets

ALGAINN LIGHT EMITTING DIODE

BACKGROUND OF THE INVENTION

1. Field of the Invention

The present invention relates to an AlGaInN LED (Light Emitting Diode, hereinafter referred to as a "LED"), and more particularly to an AlGaInN LED with improved external quantum efficiency, in which a chip employing the LED has a horizontal plane formed in a lozenge shape so that the amount of totally reflected of light is reduced when the light generated from an active layer interposed between heterosemiconductor layers with different band gaps is emitted to the outside.

2. Description of the Related Art

Generally, luminous effect generated when voltage is provided to a semiconductor device is referred to as an "electroluminance". This phenomenon was observed from crystals of silicon carbide in 1923, and it has been rapidly developed since high luminous efficiency of a p-n junction of GaAs was discovered. Then, electroluminance came to be practically used at the end of 1960.

A material suitable for the LEDs must have several requirements, as follows. First, the material must have a luminous wavelength in the range of visible or near infrared rays. Second, the material must have high luminous efficiency. Third, the material must form a p-n junction therein. Generally, the material used as the LED is selected from bi-atomic or tri-atomic compounds in 3B and 5B groups such as GaAs, GaP, $GaAs_{1-x}P_x$, $Ga_{1-x}Al_xAs$, InP, $In_{1-x}Ga_xP$. Recently, compounds in 2B and 6B groups or 4A and 4B groups are vigorously developed to be used as materials for LEDs.

Among the above-described compounds, AlGaInN is used to manufacture laser diodes or LEDs, which are capable of emitting light with wavelengths in the range of 300 nm to 600 nm. In the AlGaInN LED, when the amount of indium is increased, the wavelength of light emitted from the above AlGaInN LED is broadened. On the other hand, when the amount of aluminum is increased, the wavelength of light emitted from the above AlGaInN LED is narrowed.

FIG. 1 is a partial plan view of a chip employing a conventional AlGaInN LED. FIG. 2 is a longitudinal-sectional view of the chip in FIG. 1, taken along the line A–A'.

With reference to FIGS. 1 and 2, an n-AlGaInN layer 50 serving as an n-contact layer is grown on a transparent substrate 10 made of sapphire or SiC. An AlGaInN layer 60 is grown on the n-AlGaInN layer 50, and an active layer 70 is grown on the AlGaInN layer 60. Here, the AlGaInN layer 60 has a larger band gap than the active layer 70, and serves to obtain optical confinement, which indicates that the refractivity or gain of an active region (active layer) or a peripheral region adjacent to the active region in a semiconductor is higher than that of a surrounding clad layer so that optical energy is concentrated on the active region or its peripheral region.

The active layer 70 grown on the AlGaInN layer 60 determines the wavelength of emitted light. A p-AlGaInN layer 80 is grown on the active layer 70, and serves as a p-clad layer to obtain the optical confinement. A p-AlGaInN layer 90 serving as a p-contact layer is grown on the p-clad layer 80.

Various types of light transmission ohmic electrodes 95 are formed on the p-AlGaInN layer 90. Since the resistivity of the p-AlGaInN layer 90 is very high, the current spreading on the p-AlGaInN layer 90 cannot be facilitated. Here, the ohmic electrode 95 serves to facilitate the current spreading. A p-metal electrode 40 serving as a p-bonding pad is formed on the light transmission ohmic electrode 95. The AlGaInN layer 60, the active layer 70, the p-AlGaInN layer 80, and a part of the n-AlGaInN layer 50 are removed at a selective portion, and then an ohmic metal 30 is formed on the removed portion. Thereby, the manufacture of the LED is completed.

The LED manufactured by the above-described manner has a p-n junction diode structure, which holes entered via a p-electrode are combined with electron entered via an n-electrode within the active layer, and then light corresponding to a band gap of a material of the active layer is emitted to the outside.

The luminous efficiency of the above LED is divided into internal quantum efficiency and external quantum efficiency. The internal quantum efficiency is determined by the design of the active layer or the quality of an epitaxial layer.

The external quantum efficiency is determined by the degree of the emission of light generated in the active layer to the outside of the LED. In case of a compound of GaN or sapphire with uniform refractivity, in order to allow light to be emitted from the compound to the air with refractivity of 1, the light must be emitted from the compound at more than a critical angle.

Such a critical angle is represented by an equation of $\theta c = \sin^{-1}(\eta \text{ low}/\eta \text{ high})$. The critical angle of light emitted from GaN to air with a refractivity of 1 is 23.6°.

Light emitted from the chip to the air at not more than the above critical angle is returned to the inside of the chip, and trapped in the chip. Then, the trapped light is absorbed by the epitaxial layer or a sapphire wafer, thus allowing the external quantum efficiency to be rapidly lowered.

With reference to FIG. 1, the LED generally has a horizontal plane formed to have a rectangular shape or a regular square shape. Here, most of light generated from the LED is totally reflected within the structure of the LED as shown in FIG. 5.

In order to prevent the total reflection of the light generated in the LED, the LED can be manufactured as a TIP (truncated inverted pyramid) structure. Since the dimensions of the chip are reduced from the bottom to the top in the TIP structure of the LED, it is difficult to produce the structure. Moreover, in case the LED with the above structure is made of a strong material such as sapphire, it is more difficult to produce this structure, thus reducing the yield of the final products.

Conventionally, when the AlGaInN LED is produced to have a rectangular shape or a regular square shape, as shown in FIG. 3, the atomic arrangement of single crystals of a wafer made of sapphire or AlGaInN has a good cutting property in a direction of C and a poor cutting property in a direction of D. Accordingly, the yield of the production of the LED is lowered.

SUMMARY OF THE INVENTION

An LED chip is obtained from a wafer comprising several AlGaInN layers grown on the surface of a substrate, by scribing and breaking the wafer. In scribing and breaking the wafer, the pattern of scribing and breaking determines the cross-sectional shape of the LED chip. In a conventional LED chip, the cross-sectional shape of the broken LED chip is rectangular or square. Assuming the removed portion for n-metal is not removed from the LED chip, all the cross-sections of the LED chip have the same shape. In this patent application, each of all the assumed cross-sections is referred to as a horizontal plane which has the same boundary as those of the assumed cross-sections. A good example of the horizontal plane is the surface of the substrate on which several AlGaInN layers are grown.

Therefore, the present invention has been made in view of the above problems, and it is an object of the present invention to provide a structure of an AlGaInN LED, in which a portion of totally reflected light generated in the LED is reduced and the light is efficiently emitted to the outside.

It is another object of the present invention to provide a structure of an AlGaInN LED, in which a cleaved plane of the LED coincides with the crystal orientation of a wafer made of GaN or sapphire, thus improving the yield of the LED when the LED is cut.

It is yet another object of the present invention to provide a structure of an AlGaInN LED, in which current spreading between an anode and a cathode is optimized, thus improving luminous efficiency so that light generated in the LED is uniformly emitted.

In accordance with the present invention, the above and other objects can be accomplished by the provision of an AlGaInN LED, wherein a horizontal plane thereof is formed to have a lozenge shape.

Preferably, a p-electrode formed on a p-AlGaInN layer and an n-electrode formed on an n-AlGaInN layer may be disposed so that they face each other on the lozenge-shaped horizontal plane.

Further, preferably, acute angles of the lozenge-shaped horizontal plane may be in the range of 40° to 80°.

Moreover, preferably, inclined sides of the lozenge-shaped horizontal plane may coincide with a cleaved plane of a wafer made of GaN or sapphire.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, a preferred embodiment of the present invention will be described in detail with reference to the annexed drawings.

In the following description made in conjunction with the preferred embodiment of the present invention, a detailed description of known functions and configurations incorporated herein will be omitted when it may make the subject matter of the present invention rather unclear. Terms used in the following description are terms defined taking into consideration the functions obtained in accordance with the present invention. The definitions of these terms should be determined based on the whole content of this specification because they may be changed in accordance with the option of a user or chip designer or a usual practice.

Figure 1:
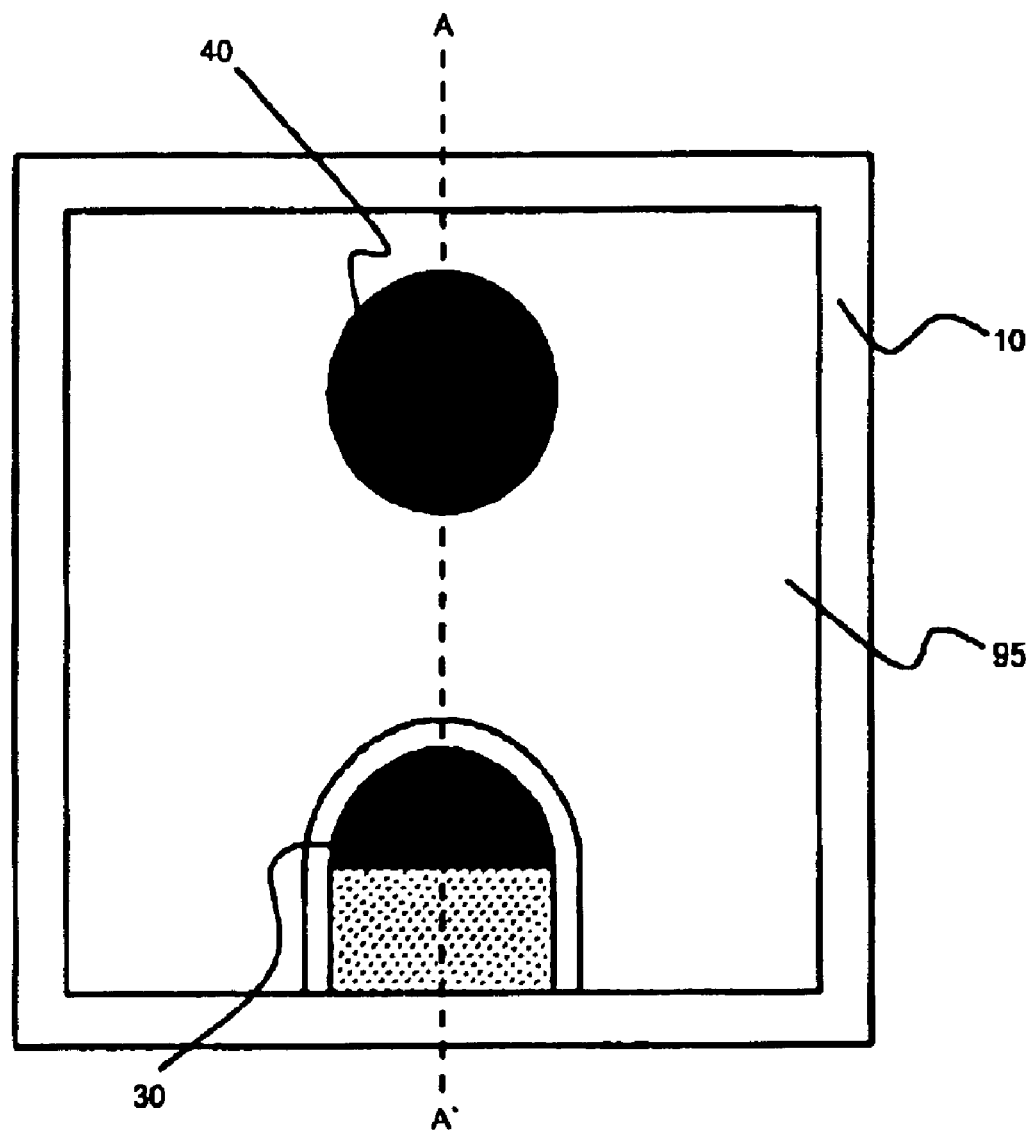
FIG. 1 is a plan view of a conventional AlGaInN LED (Light Emitting Diode)
Figure 2:
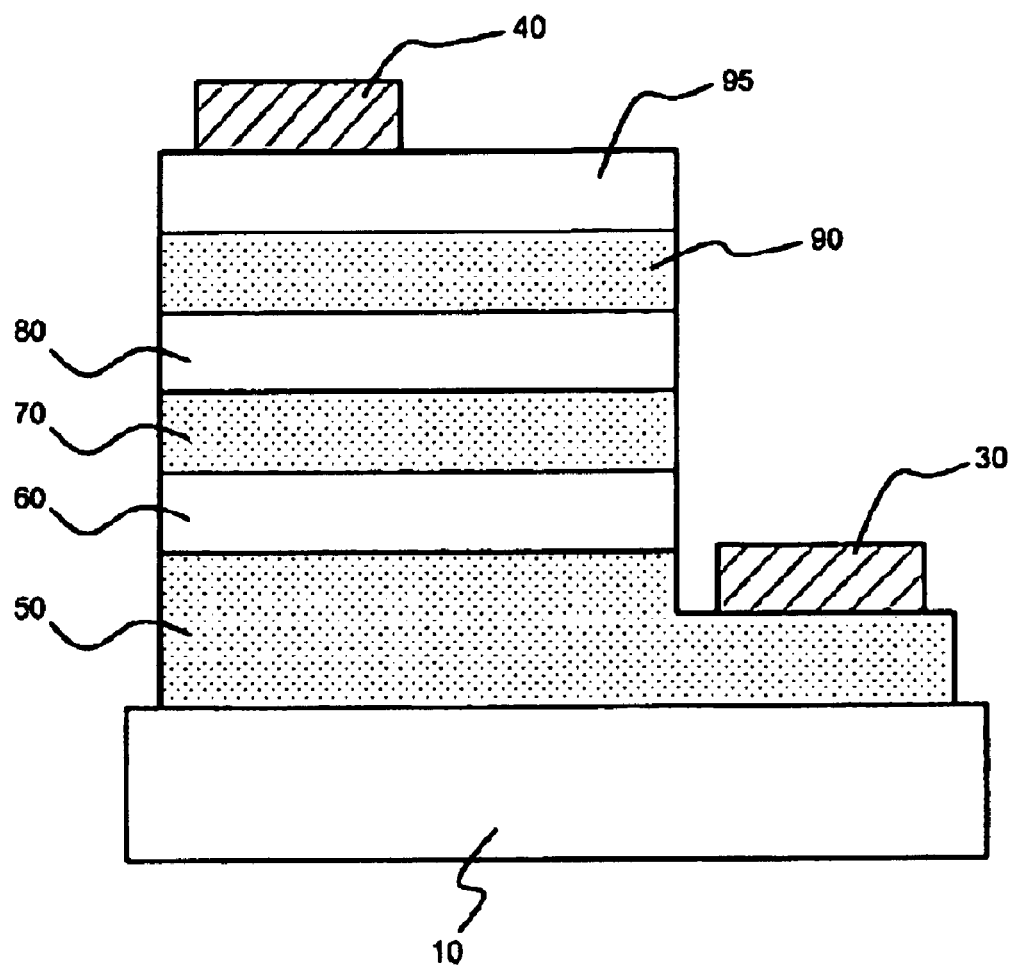
FIG. 2 is a longitudinal-sectional view taken along the line A–A' of the AlGaInN LED in FIG. 1.
Figure 3:
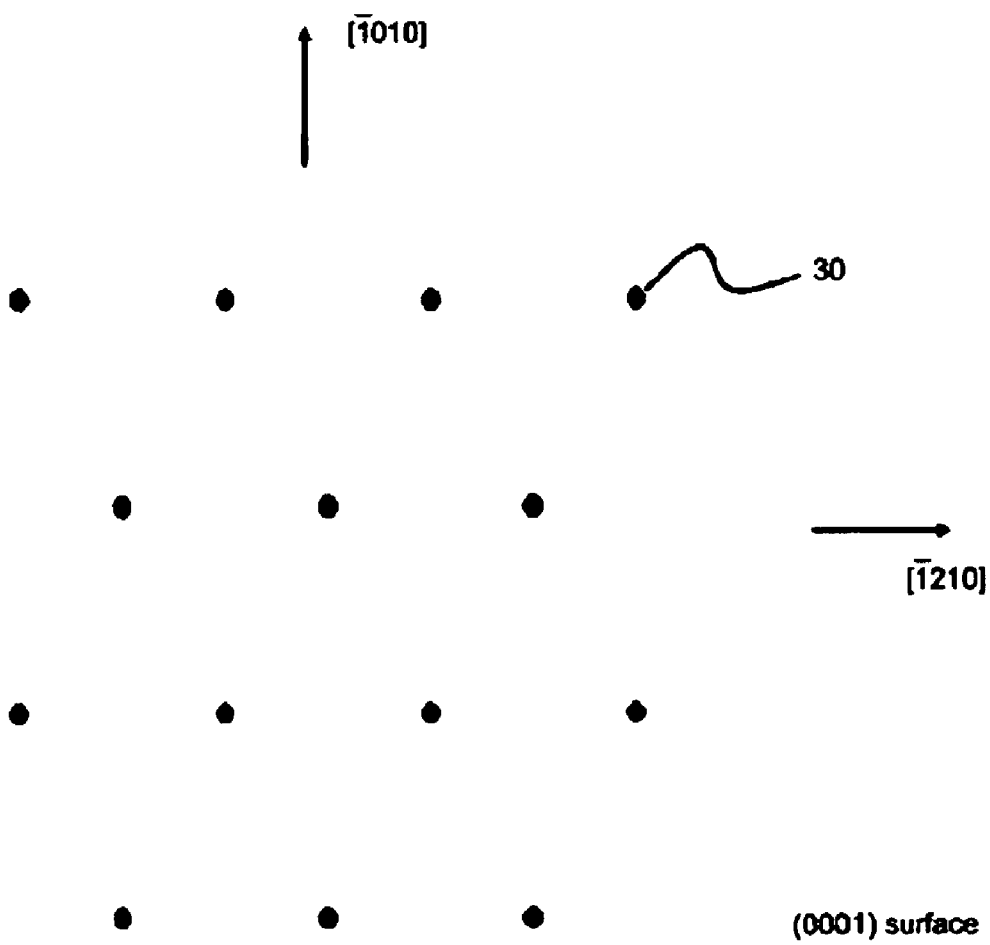
FIG. 3 is a schematic view illustrating atomic arrangement of single crystals made of sapphire or AlGaInN.
Figure 4:
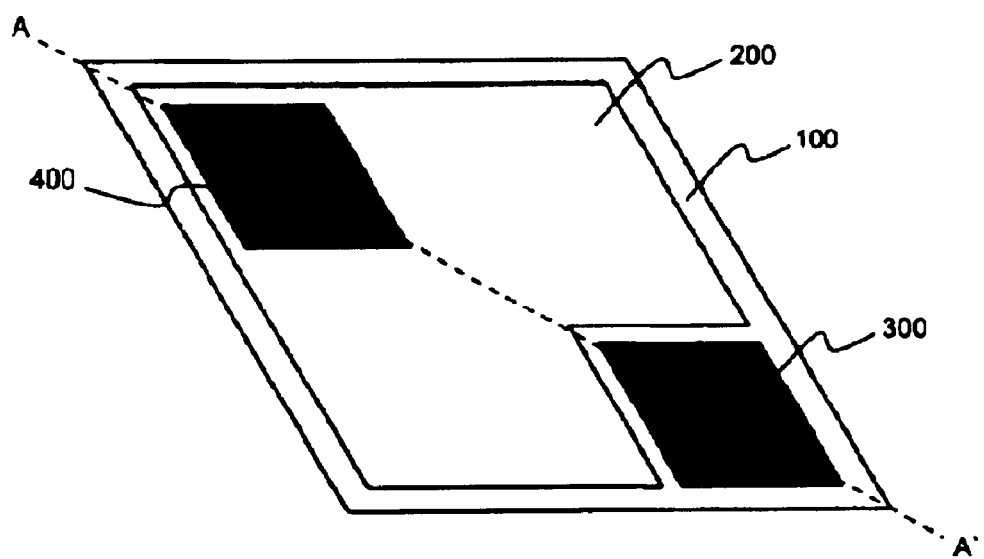
FIG. 4 is a plan view of an AlGaInN LED in accordance with the present invention.
Figure 5:
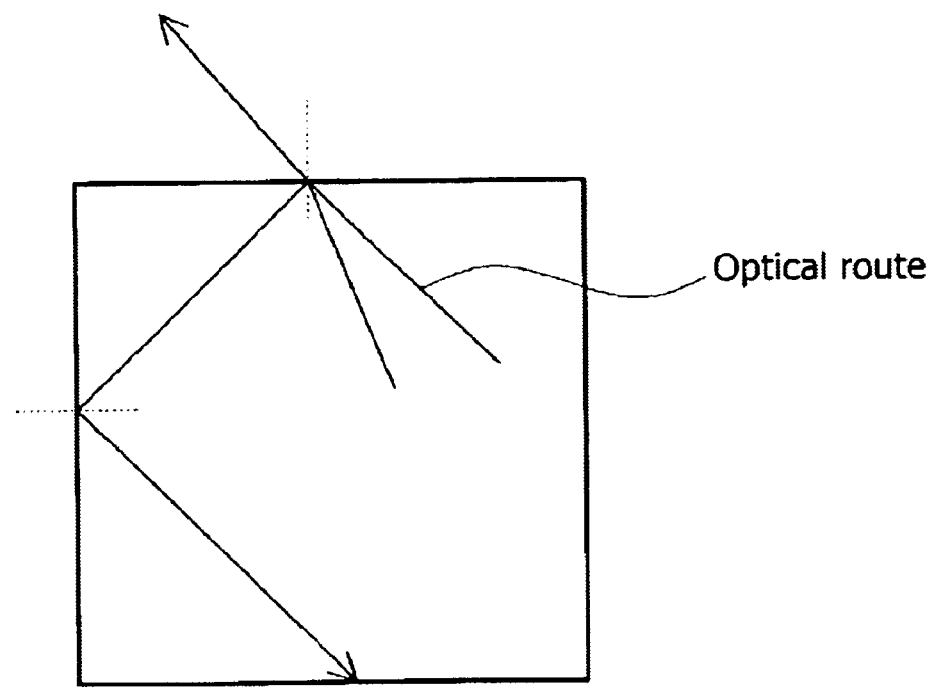
FIG. 5 is a schematic view illustrating an optical route determining external quantum efficiency of the conventional AlGaInN LED.
Figure 9:
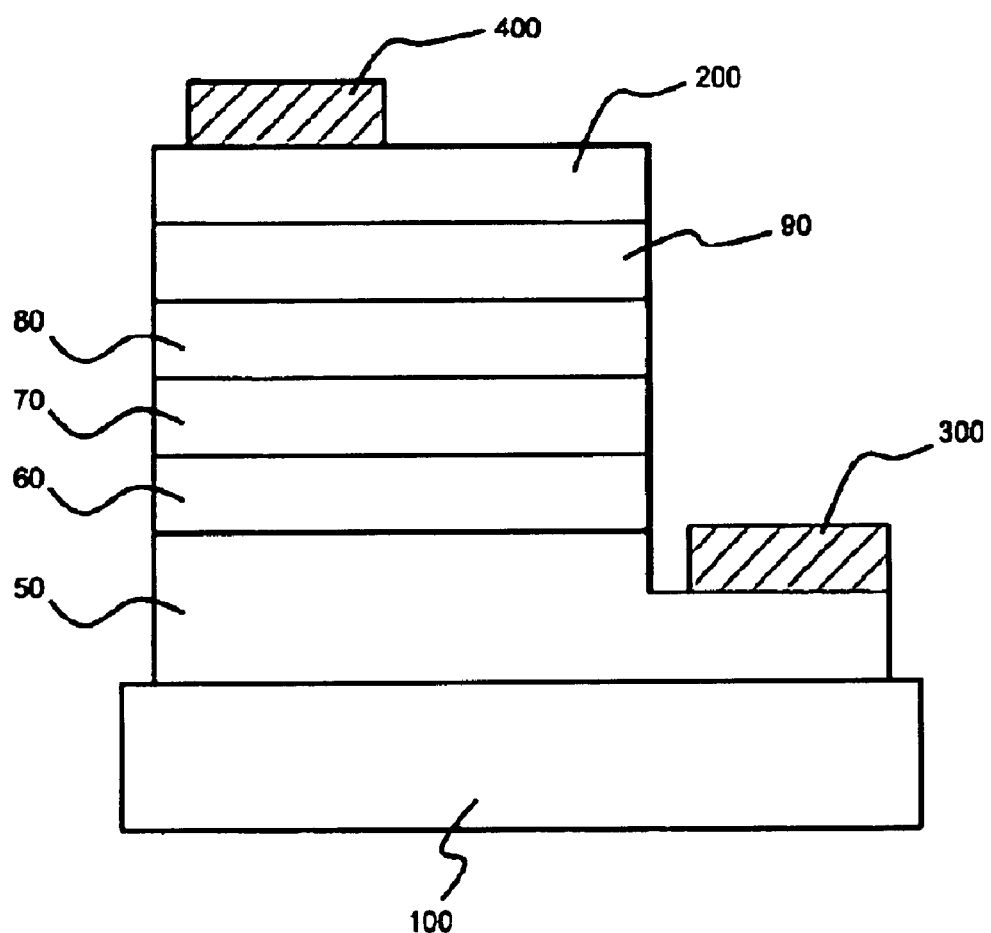
FIG. 9 is a longitudinal-sectional view taken along the line A–A' of the AlGaInN LED in FIG. 4.

FIG. 4 is a plan view of an AlGaInN LED in accordance with the present invention. With reference to FIGS. 4 and 9, a process for stacking various layers on a substrate 100 made of sapphire is substantially the same as the above-described conventional process, and a detailed description thereof will thus be omitted because it is considered to be unnecessary.

The AlGaInN LED of the present invention has a horizontal plane formed in a lozenge shape. In such a lozenge shaped structure, a p-electrode 400 formed on the p-AlGaInN layer and an n-electrode 300 formed on the n-AlGaInN layer are located at corners, which diagonally face each other and are formed at acute angles, so as to optimize the current spreading between the p-electrode 400 and the n-electrode 300.

Figure 7:
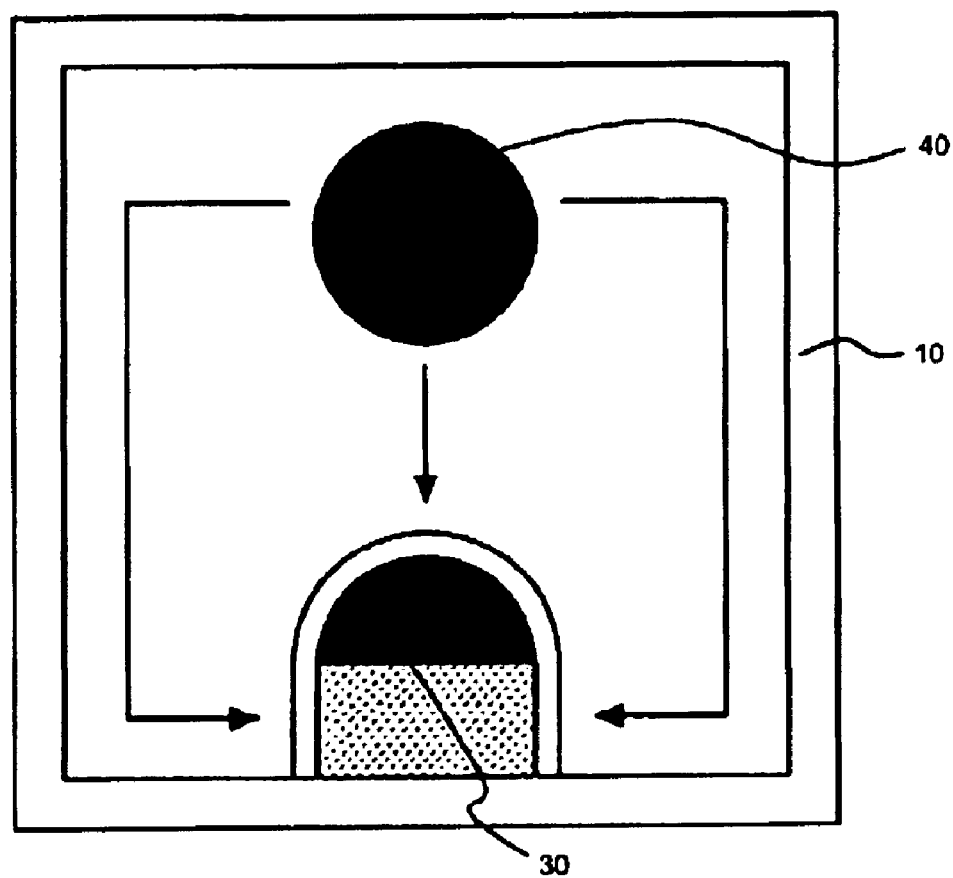
FIG. 7 is a schematic view illustrating routes for transferring current between a p-electrode and an n-electrode of the conventional AlGaInN LED.
Figure 8:
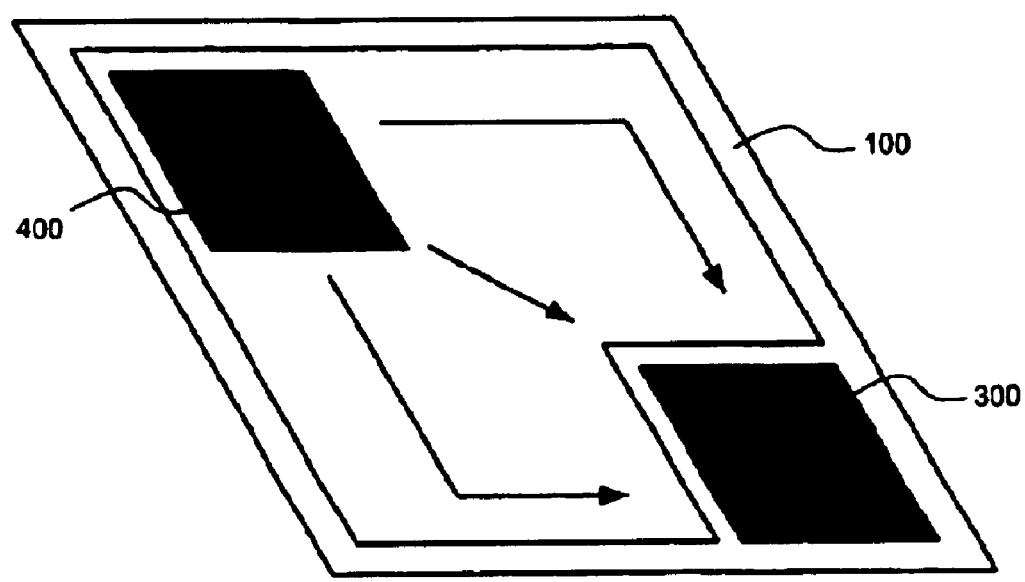
FIG. 8 is a schematic view illustrating routes for transferring current between a p-electrode and an n-electrode of the AlGaInN LED in accordance with the present invention.

With reference to FIGS. 7 and 8, compared to the conventional AlGaInN LED shown in FIG. 7, the AlGaInN LED of the present invention shown in FIG. 8 has relatively uniform routes for transferring current between the p-electrode and the n-electrode. Accordingly, the operating voltage of the AlGaInN LED of the present invention is lowered, and the luminous efficiency of light generated in the active layer is increased.

Figure 6:
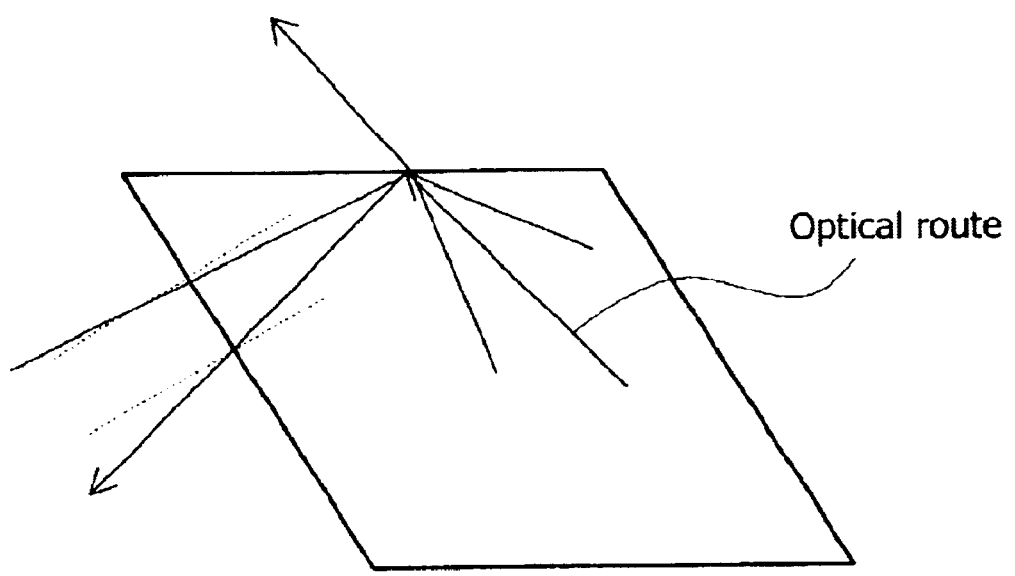
FIG. 6 is a schematic view illustrating an optical route determining external quantum efficiency of the AlGaInN LED in accordance with the present invention.

As shown in FIG. 6, compared to the conventional AlGaInN LED, in case of the AlGaInN LED of the present invention, the amount of totally reflected light is remarkably reduced, and the amount of light emitted via the side surfaces of the LED rather than the amount of light emitted via the upper and lower surfaces of the LED is sharply increased.

Accordingly, it is possible to increase the external quantum efficiency of the AlGaInN LED of the present invention determined by the degree of emission of the light generated in the active layer.

With reference to FIG. 9, an n-AlGaInN layer 50 serving as an n-contact layer is grown on a transparent substrate 100 made of sapphire or SiC. An AlGaInN layer 60 is grown on the n-AlGaInN layer 50, and an active layer 70 is grown on the AlGaInN layer 60. A p-AlGaInN layer 80 is grown on the active layer 70, and serves as a p-clad layer to obtain the optical confinement. A p-AlGaInN layer 90 serving as a p-contact layer is grown on the p-clad layer 80. A light transmission ohmic electrode 200 is formed on the p-AlGaInN layer 90 and serves to facilitate the current spreading. A p-metal electrode 400 serving as a n-bonding pad is formed on the light transmission ohmic electrode 200. An ohmic metal 300 is formed on the removed portion of the n-AlGaInN layer 50.

As apparent from the above description, the present invention provides an AlGaInN LED, in which the horizontal plane of the LED is formed to have a lozenge shape so that the amount of total reflection of light generated in the LED is reduced, thus maximizing external quantum efficiency determined by the degree of emission of the light generated in the active layer.

Further, the cleaved plane of the LED coincides with the crystal orientation of a wafer made of GaN or sapphire, thus improving the yield of the LED when the LED is cut and produced.

Moreover, an anode and a cathode of the LED are disposed so that they diagonally face each other. Accordingly, it is possible to optimize the current spreading between the anode and the cathode and to improve luminous efficiency so that light generated in the active layer is uniformly emitted.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. An AlGaInN light emitting diode comprising:
   a substrate having a surface,
   a first n-AlGaInN layer grown on the surface of the substrate,
   a second n-AlGaInN layer grown on the first n-AlGaInN layer,
   an active layer grown on the second n-AlGaInN layer,
   a first p-AlGaInN layer grown on the active layer,
   a second p-AlGaInN layer grown on the first p-AlGaInN layer,
   an electrode contacted with the second p-AlGaInN layer,
   a p-metal electrode formed on the electrode and serving as a bonding pad, and
   an ohmic metal contacted with the first n-AlGaInN layer,
   wherein the surface of the substrate has a lozenge shape and each of the first n-AlGaInN layer, the second n-AlGaInN layer, the active layer, the first p-AlGaInN layer and the second p-AlGaInN layer has a lozenge shape when viewed from the direction perpendicular to the surface of the substrate.

2. The AlGaInN light emitting diode as set forth in claim 1 wherein the p-metal electrode and the ohmic metal are disposed so that they diagonally face each other.

3. The AlGaInN light emitting diode as set forth in claim 1 wherein the acute angles of the lozenge shape are in the range of 40° to 80°.

* * * * *

UNITED STATES PATENT AND TRADEMARK OFFICE
CERTIFICATE OF CORRECTION

PATENT NO. : 6,972,437 B2
APPLICATION NO. : 10/445221
DATED : December 6, 2005
INVENTOR(S) : Chang-Tae Kim It is certified that error appears in the above-identified patent and that said Letters Patent is hereby corrected as shown below:

In item (73), on page 1 of the patent, delete "Sangsung Electro-Mechanics Co., Ltd., Kyungki-do (KR)" and replace with -- Epivalley Co., Ltd., Gyounggi-do, (KR); Samsung-Electro-Mechanics Co., Ltd. Kyungki-do, (KR) --

Signed and Sealed this

Eleventh Day of July, 2006

JON W. DUDAS
*Director of the United States Patent and Trademark Office*